US006744686B2

(12) United States Patent
Borst

(10) Patent No.: US 6,744,686 B2
(45) Date of Patent: Jun. 1, 2004

(54) SEMICONDUCTOR MEMORY MODULE WITH LOW CURRENT CONSUMPTION

(75) Inventor: Thomas Borst, Neubiberg (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/301,398

(22) Filed: Nov. 21, 2002

(65) Prior Publication Data
US 2003/0095460 A1 May 22, 2003

(30) Foreign Application Priority Data
Nov. 21, 2001 (DE) .......................... 101 57 057

(51) Int. Cl.[7] .............................................. G11C 7/00
(52) U.S. Cl. ...................... 365/226; 365/227; 365/228; 365/189.11; 327/546; 327/407
(58) Field of Search ................... 365/226, 227, 365/228, 189.11; 327/546, 407

(56) References Cited

U.S. PATENT DOCUMENTS 5,167,024 A    11/1992   Smith et al.
5,521,546 A *  5/1996    Kim ........................... 327/536
5,559,717 A *  9/1996    Tedrow et al. ............... 364/483
5,627,493 A *  5/1997    Takeuchi et al. ............. 327/546
5,670,906 A    9/1997    Roohparvar
5,822,246 A    10/1998   Taub et al.

FOREIGN PATENT DOCUMENTS

DE          40 28 175 A1      3/1991

* cited by examiner

Primary Examiner—Connie C. Yoha
(74) Attorney, Agent, or Firm—Laurence A. Greenberg; Werner H. Stemer; Gregory L. Mayback

(57) ABSTRACT

A semiconductor memory module with a changeover device by which an internal voltage supply circuit can be switched on or off in a simple manner. The changeover device has two evaluation circuits, one evaluation circuit being used for switching on the voltage supply and the second evaluation circuit being used for switching off the voltage supply. In this way, the two evaluation circuits can be optimized with regard to functionality, circuit layout and current consumption.

8 Claims, 4 Drawing Sheets

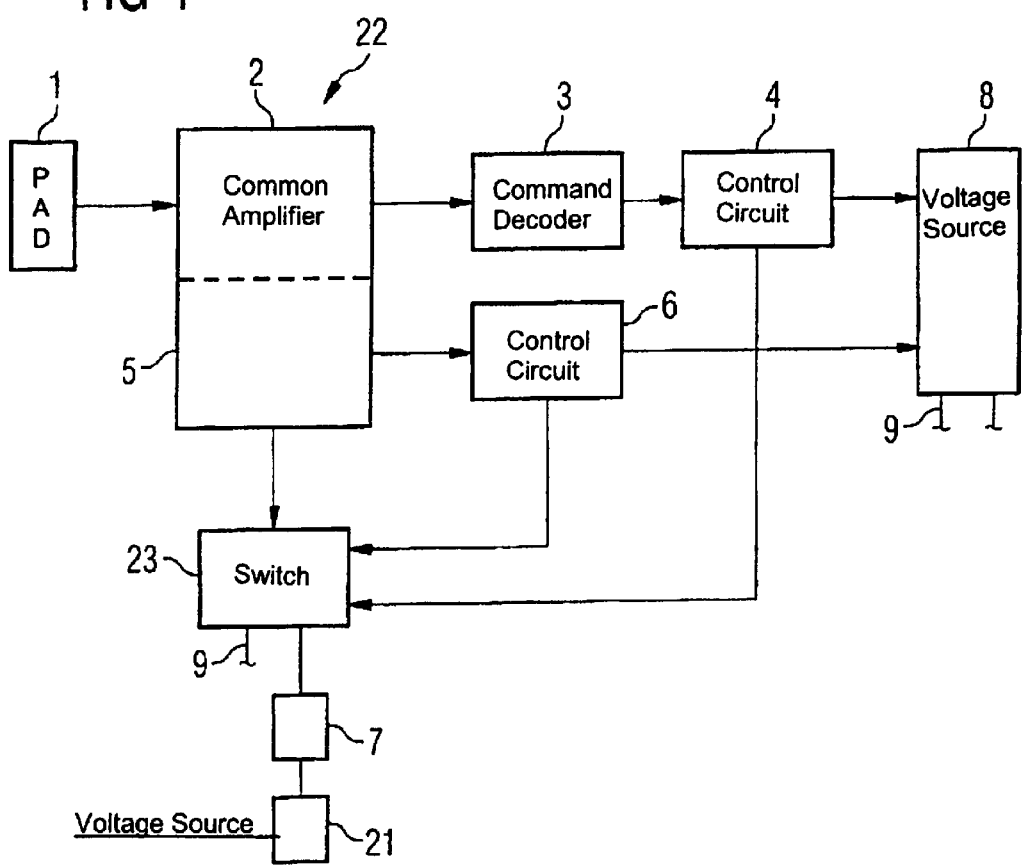

SEMICONDUCTOR MEMORY MODULE WITH LOW CURRENT CONSUMPTION

BACKGROUND OF THE INVENTION

Field of the Invention

The invention relates to a semiconductor module containing an addressing circuit for addressing memory cells of a memory array. An amplifier circuit is provided for amplifying a signal read from a memory cell and an input/output circuit is provided for reading data in or from the memory cells. A voltage supply circuit supplies an internal voltage to the components. A first evaluation circuit is connected to a switching signal and is suitable for outputting a switch-off signal for switching off the voltage supply circuit via an output if the switching signal represents a switch-off signal.

Semiconductor memory modules are used in the form of synchronous dynamic random access memories (SDRAMs), for example, for storing a large number of data with a fast access time. By way of example, memory cells with capacitors are used to store the data. The information is stored in the charge of the storage capacitor of the memory cell. Since the charge in the storage capacitor decreases over time, the charge state of the storage capacitor has to be regularly refreshed.

Semiconductor memory modules are increasingly used in mobile devices, too, such as e.g. a laptop or a mobile radio device. Since the mobile devices themselves usually carry only a limited current capacity, a low current consumption of the semiconductor memory modules is of substantial importance particularly in these applications.

A semiconductor module of the generic type that has two evaluation circuits that monitor a switching signal is already known. The evaluation circuits switch the internal voltage supply on or off depending on the signal state of the switching signal. In this way, it is possible to adapt the functionality of the internal voltage supply circuit to the actual current requirement. This procedure affords the advantage that the internal voltage supply circuit consumes less current in the switched-off state than in the switched-on state.

Published, Non-Prosecuted German Patent Application DE 4 028 175 A1, corresponding to U.S. Pat. No. 5,167,024, discloses an energy management configuration for a portable computer. The energy management configuration is provided for managing and distributing the energy which is drawn from a battery and used to supply a central unit, a memory and a plurality of peripheral devices including a user-interactive device. The energy management configuration has a control device coupled to the central unit for receiving commands from the central unit and also to the user-interactive device for receiving user inputs. The control device is additionally coupled to the battery for controlling the energy distribution between various computer units. In order to reduce the current consumption, the clock frequency of an internal clock generator is varied. Less current is consumed by prescribing a lower clock frequency.

SUMMARY OF THE INVENTION

It is accordingly an object of the invention to provide a semiconductor memory module with a low current consumption that overcomes the above-mentioned disadvantages of the prior art devices of this general type, which has a reduced current consumption.

With the foregoing and other objects in view there is provided, in accordance with the invention, a semiconductor memory module. The semiconductor memory module containing a memory array having memory cells, an addressing circuit for addressing the memory cells of the memory array, an amplifier circuit connected to the memory cells for amplifying a signal read from the memory cells, an input/output circuit connected to the memory array for reading data to/from the memory cells, a voltage supply circuit providing an internal voltage for components of the semiconductor memory module and having an input, and a first evaluation circuit having an input receiving a switching signal. The first evaluation circuit has an output coupled to the voltage supply circuit and outputs a switch-off signal for switching off the voltage supply circuit if the switching signal represents a switch-off state. A second evaluation circuit has an input receiving the switching signal. The second evaluation circuit has an output connected to the voltage supply circuit. The second evaluation circuit receives a voltage made available to the semiconductor memory module from an external voltage source. The second evaluation circuit outputs a switch-on signal to the voltage supply circuit if the switching signal represents a switch-on state.

One advantage of the invention consists in providing two evaluation circuits, a first evaluation circuit being supplied with current by an internal voltage supply and a second evaluation circuit being supplied with current by an external voltage supply. The second evaluation circuit monitors a switch-on signal for the internal voltage supply circuit. The first evaluation circuit monitors a switch-off signal for the internal voltage supply circuit. If a switch-off signal is identified by the first evaluation circuit, then the first evaluation circuit outputs a switch-off signal for switching off the voltage supply circuit. If the second evaluation circuit identifies a switch-on signal for the internal voltage supply circuit, then the second evaluation circuit switches the voltage supply circuit on again. As a result, the first evaluation circuit is also supplied with a sufficiently large supply voltage again.

The provision of two evaluation circuits makes it possible to optimally adapt the performance and the current consumption of the two evaluation circuits for the two different areas of use and tasks of the two evaluation circuits. Consequently, less current is consumed overall by the semiconductor memory module.

Preferably, the internal voltage supply circuit is switched off in the event of a deep power down command from the first supervisory circuit. In mobile devices, in particular, it is advantageous for the internal voltage supply circuit to be at least partially switched off in the event of an expected operating state in which only a very small current or hardly any current at all is required.

In one preferred embodiment, the internal voltage supply circuit is switched on or off only by the first supervisory circuit. This provides simplified driving for switching the voltage supply circuit on or off.

In a further preferred embodiment, provision is made of an amplifier circuit for receiving and forwarding the switching signal to a supervisory circuit in the second evaluation circuit. The output of the supervisory circuit forms the output of the second evaluation circuit. In this preferred embodiment, the output of the supervisory circuit is fed back to an input of the amplifier circuit. If the supervisory circuit identifies that the internal voltage supply circuit is to be switched off, then the supervisory circuit passes a switch-on signal to the amplifier circuit. Thus, the amplifier circuit of the second evaluation circuit is activated only when the internal voltage supply circuit is switched off. Consequently, no current is consumed by the amplifier circuit during an active internal voltage supply circuit. The current consumption is thus reduced overall.

In one preferred embodiment, the first supervisory circuit is configured in the form of an RS flip-flop circuit.

In a further preferred embodiment, the evaluation circuit is configured in the form of a second amplifier circuit, a command decoder and a second supervisory circuit. The second amplifier circuit is connected to the switching signal, the command decoder is connected to the output of the second amplifier circuit and the second supervisory circuit is connected to the output of the command decoder.

In one preferred embodiment, the output of the second supervisory circuit is connected to an input of the first supervisory circuit.

A further embodiment of the invention has a common amplifier circuit for the first and second evaluation circuits. As a result, overall less space is required on the semiconductor memory module in order to realize the circuit configuration according to the invention.

Other features which are considered as characteristic for the invention are set forth in the appended claims.

Although the invention is illustrated and described herein as embodied in a semiconductor memory module with low current consumption, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a block circuit diagram of a third embodiment of the changeover device.

DESCRIPTION OF THE PREFERRED EMBODIMENTS

Figure 1:
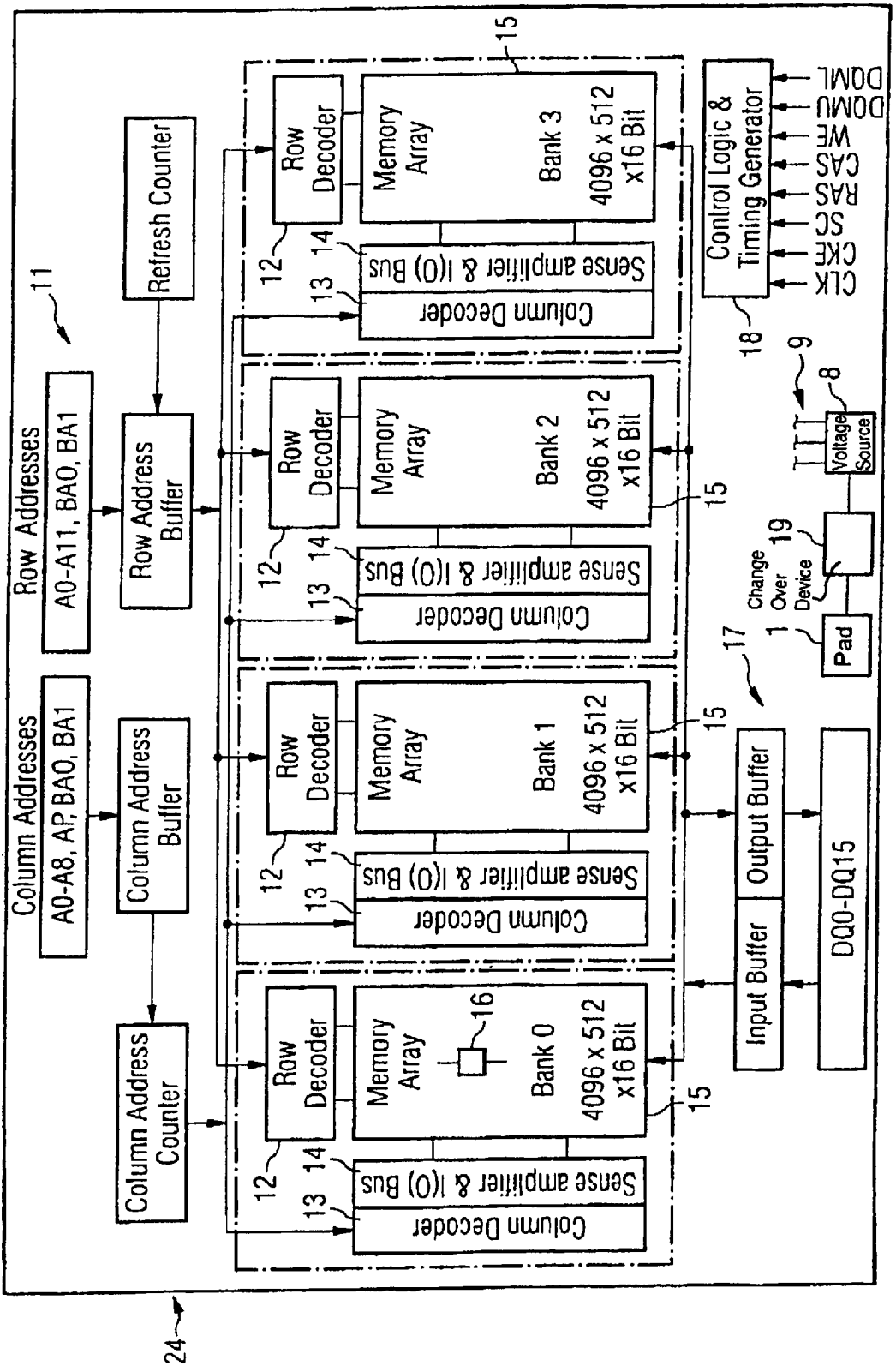
FIG. 1 is a block circuit diagram of an SDRAM semiconductor memory module according to the invention.

Referring now to the figures of the drawing in detail and first, particularly, to FIG. 1 thereof, there is shown an SDRAM semiconductor memory module 24. However, the invention can be applied to any type of memory modules.

FIG. 1 shows a schematic construction of the SDRAM memory module 24 having an addressing circuit 11, word line decoders 12, column decoders 13, amplifier circuits 14 and memory arrays 15, in which memory cells 16 are disposed in matrix form. Furthermore, an input/output circuit 17 is provided, via which data can be read from the memory cells 16 or written to the memory cells 16. Furthermore, a central control unit 18 is provided, which controls the functioning of the individual circuit configurations and provides for a synchronous data stream. By prescribing a word line address and a column address, it is possible for an individual memory cell 16 to be addressed and an information item to be written to the addressed memory cell 16 or read from the addressed memory cell. In a simple embodiment, a memory cell 16 has a selection transistor and a storage capacitor. The charge state of the storage capacitor represents the information stored in the memory cell 16. When an information item is read from the memory cell 16, the charge state is passed via a bit line to the amplifier circuit 14. For each bit line, the amplifier circuit 14 has an amplifier unit. Through the selection of a column line, which is defined by the column address, an amplifier unit 14 is selected and the charge of the selected bit line is thus forwarded to the input/output circuit 17.

The semiconductor memory module furthermore has a terminal pad 1 connected to a changeover device 19. The changeover device 19 is connected to an internal voltage supply circuit 8, which supplies the circuits of the semiconductor memory module 24 with a supply voltage via supply lines 9.

Figure 2:
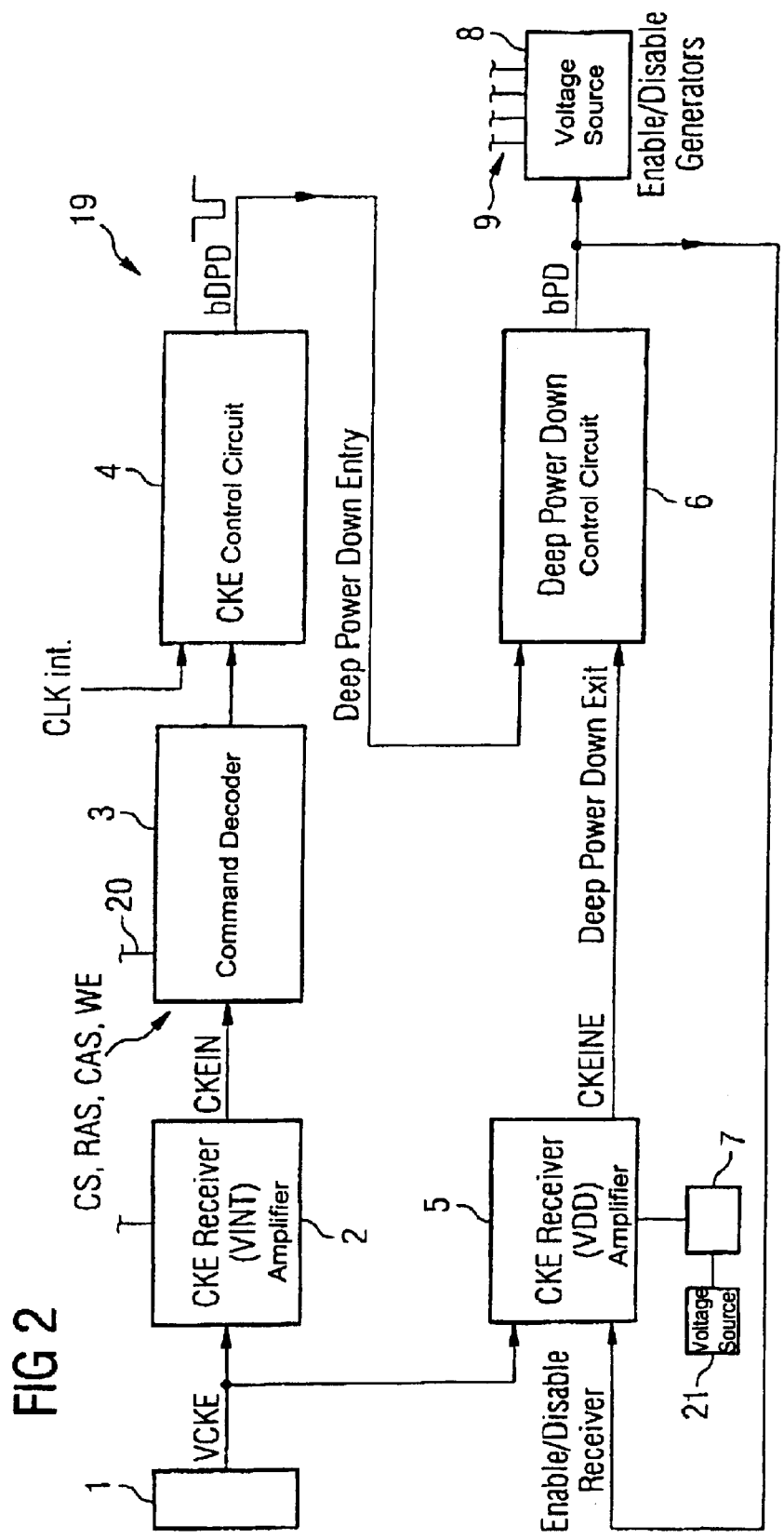
FIG. 2 is a block circuit diagram of a changeover device for switching an internal voltage supply circuit on or off.

FIG. 2 shows a first construction of the changeover device 19. The changeover device 19 has a second amplifier circuit 2, whose input is connected to a terminal pad 1. An output of the second amplifier circuit 2 is connected to an input of a command decoder 3. An output of the command decoder 3 is connected to an input of a second supervisory circuit 4. A second input of the second supervisory circuit 4 is connected to an internal clock. An output of the second supervisory circuit 4 is connected to an input of a first supervisory (control) circuit 6. The terminal pad 1 is connected to a non-illustrated control unit.

Furthermore, a first amplifier circuit 5 is provided, which is connected to the terminal pad 1 via a first input. Moreover, an output of the first amplifier circuit 5 is connected to a second input of the first supervisory circuit 6. The first supervisory circuit 6 is connected to an input of the voltage supply circuit 8 via an output. Furthermore, the output of the first supervisory circuit 6 is connected to a second input of the first amplifier circuit 5. The first amplifier circuit 5 is additionally connected to a supply terminal 7 via a supply line. The supply terminal 7 serves for the connection of an external voltage supply circuit 21 disposed outside the semiconductor memory module 24. The command decoder 3 has a command input 20, via which control signals such as e.g. CS, RAS, CAS, WE are passed to the command decoder 3. The control signals serve for controlling the functions of the semiconductor memory module 24. The second amplifier circuit 2, the command decoder 3 and the second supervisory circuit 4 represent a first evaluation circuit. The first amplifier circuit 5 and the supervisory circuit 6 represent a second evaluation circuit. The second supervisory circuit 4 is configured in the form of a storage element and a pulse generator. The first supervisory circuit 6 is configured in the form of an RS flip-flop.

The functioning of the changeover device 19 is explained in more detail below. A switching signal is passed to the second and first amplifier circuits 2, 5 via the terminal pad 1. With the switching signal it is possible to communicate a switch-on or switch-off signal for switching on or switching off the internal voltage supply circuit 8. If the second amplifier circuit 2 receives a switching signal, then the second amplifier circuit 2 forwards an amplified switching signal to the command decoder 3. Preferably, the second amplifier circuit 2 only processes switch-off signals. The first amplifier circuit 5 is provided for processing a switch-on signal. If a switch-on signal is fed via the bonding pad 1, then the switch-on signal is detected by the first amplifier circuit 5, amplified and forwarded to the first supervisory circuit 6. The first supervisory circuit 6 detects that the switch-on signal has been fed and forwards a corresponding switch-on signal to the voltage supply circuit 8. On account of the switch-on signal, the voltage supply circuit 8 is switched into an active state in which the voltage supply circuit 8 makes more power available. In a simple embodiment, the voltage supply circuit 8 is switched, by the switch-on signal, from a switched-off state, in which no voltage is made available, into a switched-on state, in which the voltage supply circuit 8 makes a voltage available.

In a preferred embodiment, the output signal of the first supervisory circuit 6 is passed to the first amplifier circuit 5. If the first amplifier circuit 5 receives a switch-on signal from the supervisory circuit 6, then the first amplifier circuit 5 switches off or at least into an operating state with a reduced power consumption.

Thus, preferably during the operating mode in which the internal voltage supply circuit provides an internal voltage supply, the first amplifier circuit 5 is operated in a current-saving operating mode. In the current-saving mode, less power has to be made available by the external voltage supply circuit 21. Thus, current is saved overall.

A switch-off signal for the internal voltage supply circuit 8 is fed to the first amplifier circuit 5 and the second amplifier circuit 2 via the terminal pad 1, then the second amplifier circuit 2 passes an amplified switch-off signal to the command decoder 3. In addition to the switch-off signal of the second amplifier circuit 2, the command decoder 3 preferably also evaluates further command signals that are fed via the command input 20. Depending on the comparison between the further command signals and the switch-off signal, the command decoder 3 forwards a switch-off signal to the second supervisory circuit 4, if the further command signals do not oppose a switch-off of the internal voltage supply circuit 8. In a simple embodiment, the evaluation of the further command signals can be dispensed with. This is the case, in particular, when a separate signal indicating a deep power down mode is present in the command decoder 3.

After receiving the switch-off signal, upon the next rising edge of the internal clock signal, the second supervisory circuit 4 passes the switch-off signal to the first supervisory circuit 6. Upon receiving the switch-off signal, the first supervisory circuit 6 forwards a corresponding switch-off signal to the internal voltage supply circuit 8. As a result, the internal voltage supply circuit 8 is switched into an inactive state, in which the internal voltage supply circuit 8 makes less power available or is completely switched off. The voltage supply circuit 8 consumes less current in the inactive state. At the same time, the first supervisory circuit 6 passes the switch-off signal to the first amplifier circuit 5.

Figure 3:
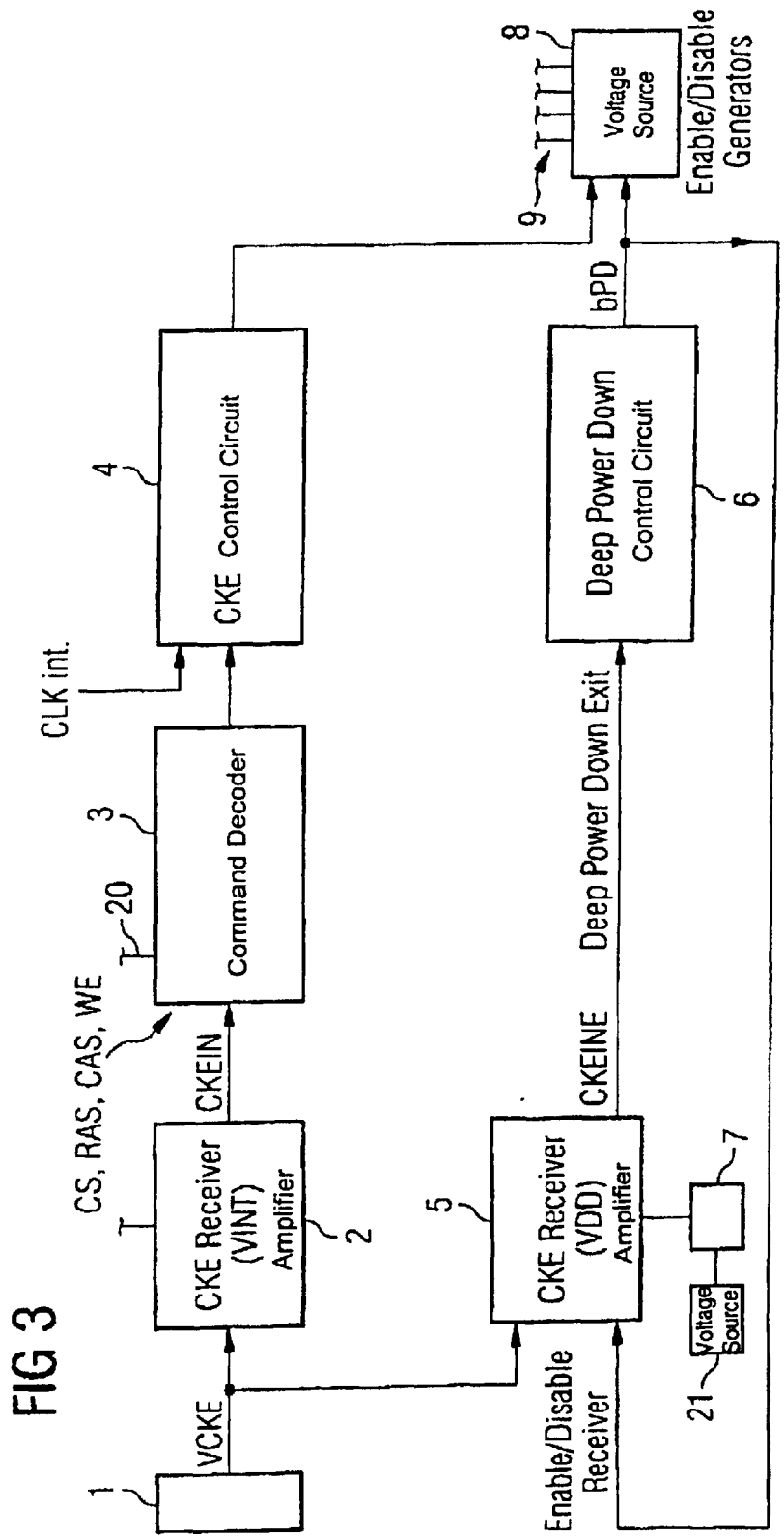
FIG. 3 is a block circuit diagram of a second embodiment of the changeover device.

In a simple embodiment illustrated in FIG. 3, the output of the second supervisory circuit 4 is directly connected to a second input of the internal voltage supply circuit 8 and switches off the internal voltage supply circuit 8 itself. In this embodiment, the first supervisory circuit 6 is connected by its output to a first input of the internal voltage supply circuit 8 and serves for switching the internal voltage supply circuit 8 into an active state, if a corresponding switch-on signal is fed to the first amplifier circuit 5 via the terminal pad 1.

The embodiment illustrated in FIG. 2 offers a simplified drive circuit, since only one input is required for controlling the internal voltage supply circuit 8.

FIG. 4 shows a further embodiment of the invention, in which the first and second amplifier circuits 5, 2 are realized in a common amplifier circuit 22. The common amplifier circuit 22 affords the advantage that less space is required on the semiconductor memory module for realizing the two functions of the first and second amplifier circuits 5, 2. However, a common amplifier circuit 22 is preferably to be supplied with current by the external voltage supply circuit 21.

Depending on the embodiment, it is also possible to provide a further switch 23, which, by way of example, is controlled by the first and/or second supervisory circuit 6, 4 and realizes a changeover between an internal and external current supply for the common amplifier circuit 22. The switch 23 is switched in such a way that the common amplifier circuit 22 is supplied with current by the external voltage supply circuit 21 when the internal voltage supply circuit 8 is not active. However, if the internal voltage supply circuit 8 is active and supplies a sufficient supply voltage, then the switch 23 is changed over and the common amplifier circuit 22 is supplied with current by the internal voltage supply circuit 8. The common amplifier circuit 22 can also be formed in the circuit configurations of FIGS. 2 and 3.

I claim:

1. A semiconductor memory module, comprising:
   a memory array having memory cells;
   an addressing circuit for addressing said memory cells of said memory array;
   an amplifier circuit connected to said memory cells for amplifying a signal read from said memory cells;
   an input/output circuit connected to said memory array for reading data to/from said memory cells;
   a voltage supply circuit providing an internal voltage for components of the semiconductor memory module and having an input;
   a first evaluation circuit having an input receiving a switching signal, said first evaluation circuit having an output coupled to said voltage supply circuit and outputting a switch-off signal for switching off said voltage supply circuit if the switching signal represents a switch-off state; and
   a second evaluation circuit having an input receiving the switching signal, said second evaluation circuit having an output connected to said voltage supply circuit, said second evaluation circuit receiving a voltage made available to the semiconductor memory module from an external voltage source, said second evaluation circuit outputting a switch-on signal to said voltage supply circuit if the switching signal represents a switch-on state.

2. The semiconductor memory module according to claim 1, wherein:
   said second evaluation circuit has an amplifier circuit with an output; and
   said second evaluation circuit is connected to said output of said first evaluation circuit, said second evaluation circuit outputs the switch-on signal to said voltage supply circuit if the switch-on signal is present at said output of said amplifier circuit.

3. The semiconductor memory module according to claim 1, wherein said first evaluation circuit is supplied the internal voltage from said voltage supply circuit.

4. The semiconductor memory module according to claim 1, wherein:
   said second evaluation circuit has a supervisory circuit with a first input, a second input, and an output;
   said second evaluation circuit has an amplifier circuit with an input receiving the switching signal and an output connected to said first input of said supervisory circuit;

said output of said first evaluation circuit is connected to said second input said second evaluation circuit and an output signal of said first evaluation circuit is fed to said second input of said supervisory circuit;

said output of said supervisory circuit is connected to said input of said voltage supply circuit;

said second evaluation circuit has an amplifier circuit with an output connected to said supervisory circuit and outputting an output signal to said supervisory circuit; and said supervisory circuit outputs one of the switch-off signal and the switch-on signal to said voltage supply circuit depending on the output signal of said amplifier circuit and depending on the output signal of said first evaluation circuit.

5. The semiconductor memory module according to claim 4, wherein said amplifier circuit has a first input and a second input connected to said output of the supervisory circuit, the switch-off signal at said output of said supervisory circuit switches on said amplifier circuit, and the switch-on signal at said output of said supervisory circuit switches off said amplifier circuit.

6. The semiconductor memory module according to claim 4, wherein said supervisory circuit is an RS flip-flop circuit.

7. The semiconductor memory module according to claim 4, wherein said first evaluation circuit includes:

a command decoder having an input and an output;

a further supervisory circuit having an input connected to said output of said command decoder, said further supervisory circuit generating an output signal of said first evaluation circuit; and a further amplifier circuit receiving the switching signal, said further amplifier circuit having an output connected to said input of said command decoder.

8. The semiconductor memory module according to claim 7, wherein said further amplifier circuit of said first evaluation circuit and said amplifier circuit of said second evaluation circuit are configured as a common amplifier circuit, and said common amplifier circuit is supplied with current by one of the external voltage source and said voltage supply circuit.

* * * * *